United States Patent [19]

Kelly et al.

[11] Patent Number: 5,296,916
[45] Date of Patent: Mar. 22, 1994

[54] MASK ALIGNMENT SYSTEM FOR COMPONENTS WITH EXTREMELY SENSITIVE SURFACES

[75] Inventors: Howard L. Kelly, Warrenton; Hans Kolan, Manassas, both of Va.; David Perlman, Wappingers Falls, N.Y.

[73] Assignee: International Business Machines Corp., Armonk, N.Y.

[21] Appl. No.: 687,256

[22] Filed: Apr. 18, 1991

[51] Int. Cl.5 .............................................. G01B 11/00
[52] U.S. Cl. .................................... 356/401; 356/400; 356/399
[58] Field of Search ............................... 356/399–401; 355/43, 53, 125, 78, 79; 118/721; 427/282; 156/291, 299, 305; 29/464, 754, 874; 437/203, 948; 148/DIG. 102, DIG. 103, DIG. 104, DIG. 105, DIG. 106

[56] References Cited

U.S. PATENT DOCUMENTS

| | | | |
|---|---|---|---|
| 3,645,622 | 2/1972 | Cachon et al. | 356/399 |
| 3,671,125 | 6/1972 | Matvecvich et al. | 356/399 |
| 4,372,248 | 2/1983 | Mortin | 118/720 |
| 4,397,078 | 8/1983 | Inahashi | 29/574 |
| 4,474,469 | 10/1984 | Abe | 356/153 |
| 4,551,629 | 11/1985 | Carson | 250/208.2 |
| 4,646,128 | 2/1987 | Carson | 357/74 |
| 4,746,548 | 5/1988 | Boudreau | 427/248.1 |
| 4,755,053 | 7/1988 | Levinson et al. | 356/399 |
| 4,772,123 | 9/1988 | Radner | 356/153 |
| 4,817,556 | 4/1989 | Mears et al. | 118/503 |

OTHER PUBLICATIONS

E. Kolanowski et al., "Silicon Memory Cube", IBM Technical Disclosure Bulletin, vol. 18, No. 20, Mar. 1976 pp. 3239-3242.

*Primary Examiner*—Richard A. Rosenberger
*Assistant Examiner*—K. P. Hantis
*Attorney, Agent, or Firm*—Lauren C. Bruzzone; Jesse L. Abzug

[57] ABSTRACT

An apparatus and method for aligning an irregularly shaped object with a contact mask is disclosed. The apparatus includes a means for holding the irregularly shaped object, a means for holding a contact mask, a means for keeping the object and contact mask apart during alignment, means for optically aligning the contact mask to the object, and a means to bring the cube and object together once aligned. A conventional mask alignment tool has been modified to support a clamping fixture which holds the object in a fixed position. It includes a wafer sized disk made of deformable material which permits the edges of the disk to be in contact with the mask, yet when deflected by vacuum pressure will keep the surface of the object away from the contact mask assembly. Upon proper alignment, the vacuum is released and the deformable disk allows the object to cone in contact with the contact mask. In the method of the invention, the process steps include holding an object and contact mask in a spaced relationship from each other, optically aligning the object and contact mask through the holes in the contact mask, and bringing the object and contact mask together once aligned.

11 Claims, 2 Drawing Sheets

MASK ALIGNMENT SYSTEM FOR COMPONENTS WITH EXTREMELY SENSITIVE SURFACES

BACKGROUND OF THE INVENTION

1. Field of the Invention

This invention relates to a method and apparatus for aligning a contact mask with an irregularly shaped object intolerant of contact during alignment. In particular, an apparatus and process for aligning a contact mask with a semiconductor memory cube is described.

2. Background Information

Computer memories have achieved greater and greater density as the computer industry has matured. Traditionally, these memories are created on a semiconductor wafer and then diced into individual memory chips. Input/Output (I/O) connections between chip and package are made using wire bond or solder ball technologies or other well-known processes. A description of solder ball technology can found in U.S. Pat. Nos. 3,429,040 and 3,401,126 which are assigned to the Assignee of this invention.

To achieve even greater packaging density for semiconductor components, it is known that individual chips can be laminated together. Additional information on this technology can be found in *IBM Technical Disclosure Bulletin,* Vol. 18, NO. 10, March 1976, pp. 3239-3242 and in U.S. Pat. Nos. 4,551,629 and 4,646,128. With this arrangement, it is no longer possible to make I/O connections on the top surfaces of the chips because they are no longer accessible. Therefore, it is required to make I/O connections along the exposed perimeters of the individual chips.

FIG. 1 shows a diagram of a memory cube 10 made up of individual chips 12 laminated together. One surface of the cube 14, which is made up of the edge surfaces of a common side of the chips 12, serves as the I/O surface for the package. When depositing the metallurgy for I/O connection using solder ball technology, there is one step in the process where a contact mask 20 as shown in FIG. 2 must be aligned with the pattern of connection sites on the memory cube without any touching of the surface. Then, the contact mask is clamped to the cube in a fixture for further processing. The surface of the memory cube is absolutely intolerant of any sliding friction during this alignment and clamping procedure, since the metal previously deposited could be damaged.

Conventional mask alignment tools cannot meet this requirement since they allow a contact mask to slide on top of a wafer or other object in process during the alignment. Additionally, conventional tooling is not adapted to handle non-wafer shaped structure, such as a cube. Therefore, it is desirable to have an apparatus and method for aligning a contact mask and a non-wafer shaped structure, such as a memory cube, without the two touching until alignment is completed. At the point, contact is permitted and the objects can be clamped together for further processing steps, such as metal deposition.

OBJECTS OF THE INVENTION

It is an object of this invention to provide an apparatus for aligning a contact mask with an irregularly shaped object.

It is another object to provide a method for aligning a contact mask with an irregularly shaped object having a sensitive surface in a metal deposition process.

It is still another object to provide an apparatus and method for aligning a contact mask with a semiconductor memory cube which provides for zero contact during the alignment process.

It is an additional object to provide an apparatus and method for aligning and clamping a contact mask to a memory cube.

SUMMARY OF THE INVENTION

These and other objects of the invention as will be more fully apparent are provided by the following apparatus and method. The apparatus includes a means for holding the irregularly shaped cube, a means for holding the contact mask, a means for keeping the cube and contact mask apart during alignment, and a means to bring the cube and mask together once aligned. A mask alignment tool has been modified to support a clamping fixture which holds the cube in a fixed position. It includes a wafer sized disk made of deformable material which permits the edges of the disk to be in contact with the mask, yet when defected by vacuum pressure will keep the surface of the cube away from the contact mask assembly. Upon proper alignment, the vacuum is released and the deformable disk allows the cube to come in contact with the contact mask.

In the method of the invention, the process steps include holding a cube and contact mask in a spaced relationship from each other, optically aligning the cube and contact mask through the holes in the contact mask, and bringing the cube and contact mask together once aligned.

DESCRIPTION OF THE PREFERRED EMBODIMENT

In the preferred embodiment, a contact mask alignment tool for use with semiconductor wafers was modified to accommodate an irregularly shaped memory cube. The construction of the conventional alignment tool will not be described in full, except to the extent necessary to understand and practice the modification made as apart of this invention. Additionally, while the description describes a semiconductor memory cube, the invention is equally applicable to other semiconductor components, or any other process for manufacturing product in which an irregularly shaped object must be spaced apart from another object during an alignment process and then clamped together upon completion of the alignment.

Figure 1:
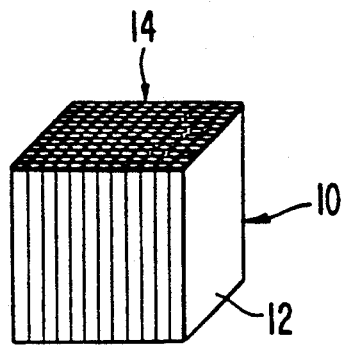
FIG. 1 shows a cabinet projection of a memory cube.
Figure 2:
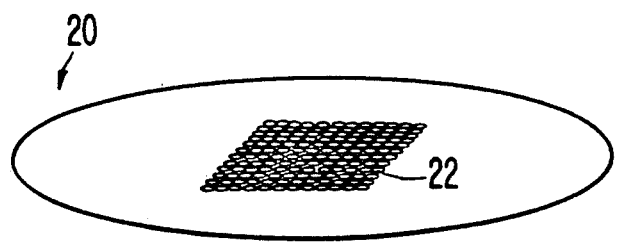
FIG. 2 shows a perspective view of a typical contact mask.

FIG. 2 shows a contact mask 20 containing a pattern of holes 22 through which metal will eventually be deposited upon the memory cube 10 (FIG. 1). The key to successful metal deposition is the precise alignment of the contact mask 20 with the pattern of pad sites on the top edge 14 of the memory cube 10.

Figure 3:
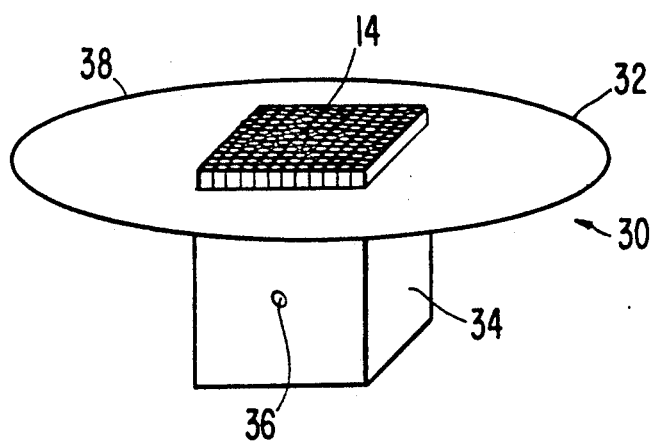
FIG. 3 shows a perspective view of memory cube within a holding fixture.

To accommodate the memory cube in the alignment tool, which was originally designed for semiconductor wafers, a new holding fixture 30 was designed, as shown in FIG. 3. Holding fixture 30 consists of two parts affixed together: a wafer sized disk 32, which has a center cut-out dimensioned to accommodate the edge 14 of the memory cube; and a receptacle 34 which can accommodate the memory cube and allow its clamping by means of a set screw 36. The material of the wafer size disk 32 must be such that the disk can be deformed without too much force required so that the surface 14 of the memory cube 10 can be moved below the edge 38 of the disk 32. Also, the material must be capable of withstanding the temperature and pressure conditions used in subsequent processing steps. In the preferred embodiment, the material chosen was stainless steel with a nominal thickness of 0.013 inches.

The means for moving the holding fixture 30 and memory cube 10 will now be described with reference to FIGS. 4A–4B. A center, two part pedestal 40 which provides for vacuum application at the top is mounted to an X-Y motion table 46,48 that is part of the alignment tool 50. Pedestal 40 is used to move the cube 10 in its custom-designed holding fixture 30 within the confines of an outer clamping fixture 60. Clamping fixture 60 is then locked and the entire assembly removed for processing after mask alignment.

The top portion 42 of the pedestal 40 comprises a metal sleeve with a vacuum port 43 located along its top surface. This allows for vacuum force to be applied to the bottom of the memory cube holding fixture 30. The bottom portion 44 of pedestal 40 contains an internal chamber 45 which provides a vacuum line. Making the connection between bottom 44 and top 42 is a spring 49 which provides the biasing between the two portions. Spring 49 is shown compressed in FIG. 4A. Bottom portion 44 is connected to the X-Y table represented by X motion table 46 and Y motion table 48. O-ring seals 51 are provided to maintain a vacuum sealed environment. Vacuum is applied at inlet port 52.

Clamping fixture 60 is comprised of two concentric circular rings 62 and 64. The concentric rings allow for viewing from above through a microscope (not shown). When the contact mask 20 and the memory cube 10 are properly aligned, the clamping fixture will be locked using clips 66. Then, the whole fixture with contact mask 20 and memory cube 10 aligned is removed and can be taken to other tools for further processing.

Figure 4A:
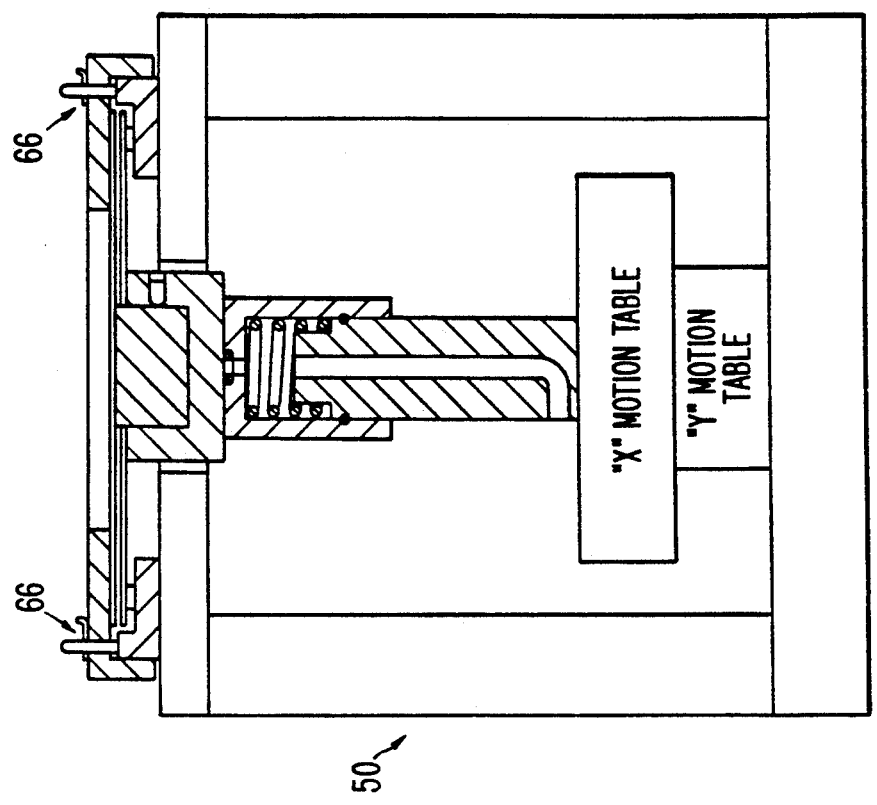
FIG. 4A shows a cross-sectional view of the alignment system during the alignment process.
Figure 4B:
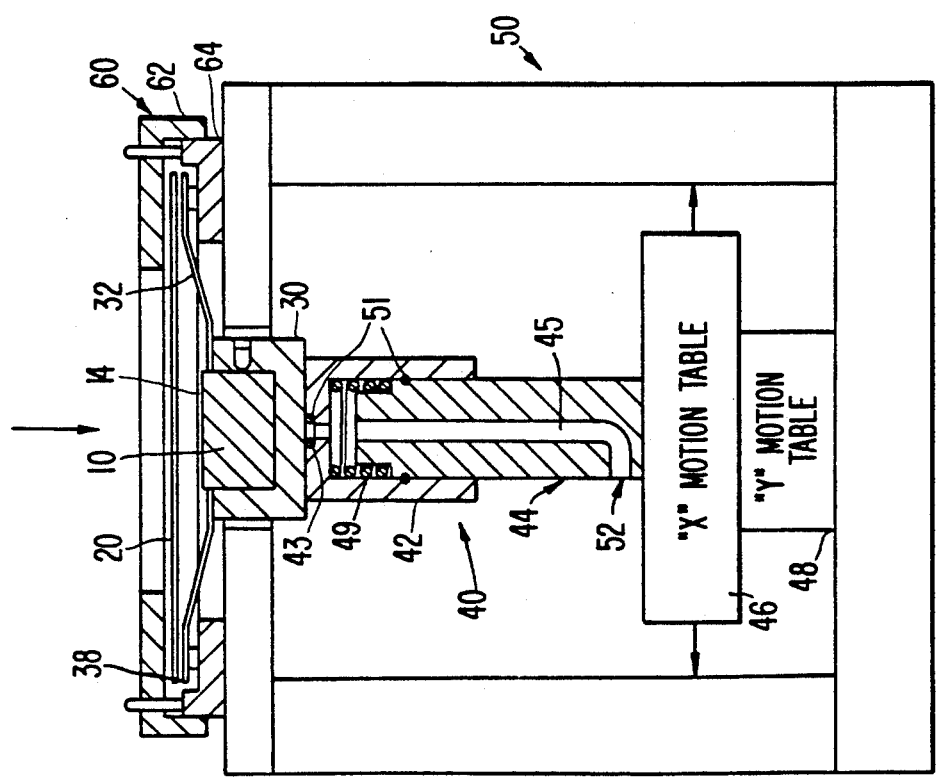
FIG. 4B shows a cross-sectional view of the alignment system after alignment and clamping.

Referring to FIG. 4A, when vacuum is applied to port 52, the holding fixture 30 and the top portion 42 of pedestal 40 are drawn downward by the vacuum force. Because of the "spring loaded" design of the pedestal 40 (i.e. The top portion 42 is movable downward around the bottom, fixed portion 42 when sufficient force is exerted to overcome the internal spring) and the temporary deformability achieved through the thin disk 32 being held up about its outer perimeter 38 while being pulled down at its center, the center area of the disk, and thus the cube surface 14 is held depressed slightly in relation to the top surface height of the disk at its perimeter. This means it will be slightly below the bottom surface of the contact mask 20 when the mask is placed on top of the disk 32. Thus, when the X-Y table is adjusted by the operator (who looks down through a microscope mounted above with its split optics for alignment of the two patterns), the cube 10 can be moved around just far enough below the mask 20 to prevent contact, but close enough to ensure good alignment.

When the proper alignment position is attained, the vacuum is released, allowing the cube 10 to move directly upwards, with no side frictional components, against the mask 20. The holding fixture 60 is clamped in this position to hold the mask and the holding fixture 30. It is then locked with removable clips 66 as shown in FIG. 4B. At this time, the locked fixture is removed from the tool and is ready for processing.

In alternate embodiments, the wafer sized disc 32 could be a rigid member. The movement of the memory cube 10 is then effected by other biasing means, for example, springs, hydraulic pistons, etc. The important aspect is that the surface 14 does not touch the contact mask 20 until alignment is completed.

While the invention has been described with a reference to a preferred embodiment, it will be understood by those skilled in the art that changes can be made to the apparatus and method without departing from the spirit, scope and teachings of the invention. Accordingly, the invention shall be limited only as specified in the claims.

We claim:

1. An apparatus for contact masking a substrate comprising:
   first means for holding a substrate, wherein said first means includes a deformable disk, one surface of said deformable disk supporting said substrate;
   a contact mask;
   means for holding said contact mask;
   separating means for keeping said substrate and said contact mask apart during optical alignment;
   aligning means for optically aligning said substrate and said contact mask, said aligning means aligning through apertures in the contact mask to alignment features disposed on said substrate;
   second means for bringing said substrate and said contact mask in contact once aligned and locking means for holding together the first means and means for holding a contact mask in superposed, aligned relation as a fixture, whereby the fixture can be transported for processing of the substrate.

2. The apparatus as claimed in claim 1 wherein said separating means includes a pedestal having a top portion and a bottom portion.

3. The apparatus as claimed in claim 2 wherein said top portion and said bottom portion are concentric cylinders having dimensions such that the top portion is free to slide over said bottom portion and have biasing means in between to provide a biasing force.

4. An apparatus as in claim 1 wherein said separating means includes a means for deforming said deformable disk away from said contact mask.

5. An apparatus as in claim 4 wherein said means for deforming comprises applying a vacuum to that surface of said deformable disk which is opposite to said supporting surface.

6. An apparatus for contact masking a substrate comprising:
   first means for holding a substrate, wherein said first means includes a deformable disk, wherein said deformable disk has a cutout having the same shape as the substrate;
   a contact mask
   means for holding said contact mask;
   separating means for keeping said substrate and said contact mask apart during optical alignment;

aligning means for optically aligning said substrate and said contact mask, said aligning means aligning through apertures in the contact mask to alignment features disposed on said substrate; and second means for brining said substrate and said contact mask in contact once aligned and locking means for holding together the first means and means for holding a contact mask in superposed, aligned relation as a fixture, whereby the fixture can be transported for processing of the substrate.

7. An apparatus for contact masking a substrate comprising:

first means for holding a substrate, wherein said first means includes a deformable disk, wherein said deformable dick includes a receptacle for securing the substrate;

a contact mask;

means for holding said contact mask;

separating means for keeping said substrate and said contact mask apart during optical alignment;

aligning means for optically aligning said substrate and said contact mask, said aligning means aligning through apertures in the contact mask to alignment features disposed on said substrate; and second means for bringing said substrate and said contact mask in contact once aligned and locking means for holding together the first means and means for holding a contact mask in superposed, aligned relation as a fixture, whereby the fixture can be transported for processing of the substrate.

8. A method for contact masking an irregularly shaped substrate comprising the steps of:

holding said substrate and contact mask in spaced relationship from each other, said holding step including the application of a vacuum force directly to said substrate said application biasing said substrate away from the contact mask;

optically aligning said substrate and said contact mask through the aperture and said contact mask to alignment features disposed on said substrate;

locking the irregular shaped substrate and contact mask together once aligned, and transporting the locked aligned irregular shaped substrate and the contact mask for processing of the irregular shaped substrate.

9. The method as claimed in claim 8 wherein said bringing step includes a step of releasing the vacuum to restore the substrate to its original position.

10. Apparatus for contact masking an object comprising:

a) a first transportable means including a deformable member and a disk connected together to hold an object, b) means including a transportable cover for supporting a contact mask, c) aligning means for optically aligning said object and said contact mask, said aligning means aligning through apertures in the contact mask to alignment features disposed on said object, d) vacuum separating means for keeping said object and contact mask apart during optical alignment, said means applied to said deformable member;

e) mechanical means for bringing said object and said contact mask in contact once aligned; and f) locking means for holding the transportable member, the transportable holding means and contact mask in an aligned relationship as a fixture, whereby said fixture can be transported for processing of the object.

11. An apparatus for contact masking a substrate comprising:

first means for holding a substrate, said first means including a deformable disk, said deformable disk having a cutout the same shape as the substrate and includes a receptacle for securing the substrate;

means for holding a contact mask;

separating means for keeping said substrate and contact mask apart during optical alignment, said separating means including a pedestal having a top portion and a bottom portion, said top portion and said bottom portion being concentric cylinders having dimensions such that the top portion is free to slide over said bottom portion and have biasing means in between to provide a biasing force;

means for providing a vacuum force through said pedestal to said first means;

aligning means for optically aligning said substrate and said contact mask, said aligning means aligning through apertures in the contact mask to alignment features disposed on said substrate;

second means for bringing substrate and said contact mask in contact once aligned, and locking means for holding together the first means and means for holding a contact mask in superposed aligned relation as a fixture, whereby the fixture can be transported for processing of the substrate.

* * * * *